(12) United States Patent
Gaidon et al.

(10) Patent No.: US 11,475,248 B2
(45) Date of Patent: Oct. 18, 2022

(54) AUTO-LABELING OF DRIVING LOGS USING ANALYSIS-BY-SYNTHESIS AND UNSUPERVISED DOMAIN ADAPTATION

(71) Applicant: Toyota Research Institute, Inc., Los Altos, CA (US)

(72) Inventors: Adrien David Gaidon, Mountain View, CA (US); James J. Kuffner, Jr., Saratoga, CA (US); Sudeep Pillai, Boston, MA (US)

(73) Assignee: Toyota Research Institute, Inc., Los Altos, CA (US)

( * ) Notice: Subject to any disclaimer, the term of this patent is extended or adjusted under 35 U.S.C. 154(b) by 1000 days.

(21) Appl. No.: 16/175,210

(22) Filed: Oct. 30, 2018

(65) Prior Publication Data

US 2020/0134379 A1    Apr. 30, 2020

(51) Int. Cl.
*H04L 43/04*    (2022.01)
*H04L 43/02*    (2022.01)
(Continued)

(52) U.S. Cl.
CPC .......... *G06K 9/6259* (2013.01); *G06F 30/20* (2020.01); *G06N 3/088* (2013.01); *G06N 5/04* (2013.01);
(Continued)

(58) Field of Classification Search
CPC ...... G06K 9/6259; G06V 20/56; G06N 3/088; G06N 5/04; H04L 43/02; H04L 43/024; H04L 43/04
(Continued)

(56) References Cited

U.S. PATENT DOCUMENTS

| 9,075,824 B2* | 7/2015 | Gordo | ................. G06F 16/583 |
| 9,299,008 B2* | 3/2016 | Huang | ................. G06K 9/62 |

(Continued)

FOREIGN PATENT DOCUMENTS

WO    2017055878 A1    4/2017

OTHER PUBLICATIONS

Learning driving situation and behaviour models from data Matthias Platho, Horst-Michael Grob and Julian Eggert IEEE Annual conference (ITSC 2013), Oct. 6-9, 2013.*
(Continued)

*Primary Examiner* — Tauqir Hussain
(74) *Attorney, Agent, or Firm* — Christopher G. Darrow; Darrow Mustafa PC

(57) ABSTRACT

Acquiring labeled data can be a significant bottleneck in the development of machine learning models that are accurate and efficient enough to enable safety-critical applications, such as automated driving. The process of labeling of driving logs can be automated. Unlabeled real-world driving logs, which include data captured by one or more vehicle sensors, can be automatically labeled to generate one or more labeled real-world driving logs. The automatic labeling can include analysis-by-synthesis on the unlabeled real-world driving logs to generate simulated driving logs, which can include reconstructed driving scenes or portions thereof. The automatic labeling can further include simulation-to-real automatic labeling on the simulated driving logs and the unlabeled real-world driving logs to generate one or more labeled real-world driving logs. The automatically labeled real-world driving logs can be stored in one or more data stores for subsequent training, validation, evaluation, and/or model management.

20 Claims, 6 Drawing Sheets

(51) Int. Cl.
| | |
|---|---|
| *G06K 9/62* | (2022.01) |
| *G06V 20/56* | (2022.01) |
| *G06N 5/04* | (2006.01) |
| *G06N 3/08* | (2006.01) |
| *G06F 30/20* | (2020.01) |
| *G07C 5/02* | (2006.01) |
| *G06F 16/23* | (2019.01) |

(52) U.S. Cl.
CPC .......... *G06V 20/56* (2022.01); *G06F 16/2365* (2019.01); *G07C 5/02* (2013.01); *H04L 43/04* (2013.01)

(58) Field of Classification Search
USPC .......................................................... 706/20
See application file for complete search history.

(56) References Cited

U.S. PATENT DOCUMENTS

| | | | | |
|---|---|---|---|---|
| 9,558,268 | B2* | 1/2017 | Tuzel | G06V 10/751 |
| 10,019,652 | B2 | 7/2018 | Wang et al. | |
| 10,599,546 | B1* | 3/2020 | Walther | G06F 11/3457 |
| 11,340,622 | B2* | 5/2022 | Refaat | G05D 1/0219 |
| 2017/0200063 | A1* | 7/2017 | Nariyambut Murali | G06K 9/6274 |
| 2017/0243083 | A1* | 8/2017 | Wang | G06V 20/40 |
| 2018/0357514 | A1* | 12/2018 | Zisimopoulos | G06V 10/82 |
| 2019/0080206 | A1* | 3/2019 | Hotson | G06K 9/6264 |
| 2019/0147582 | A1* | 5/2019 | Lee | G06T 5/005 382/156 |
| 2019/0325243 | A1* | 10/2019 | Sikka | G06V 10/255 |
| 2019/0370666 | A1* | 12/2019 | Ros Sanchez | G06N 3/084 |
| 2020/0012904 | A1* | 1/2020 | Zhao | G06V 30/194 |
| 2020/0380721 | A1* | 12/2020 | Rampal | G06K 9/6262 |
| 2021/0027103 | A1* | 1/2021 | Brower | G06K 9/6262 |
| 2022/0066456 | A1* | 3/2022 | Ebrahimi Afrouzi | A47L 11/4011 |

OTHER PUBLICATIONS

Vehicles of the Future: A Survey of Research on Safety Issues Cem Bila, Fikret Sivrikaya, Manzoor A. Khan, and Sahin Albayrak IEEE Transactions on Intelligent Transportation Systems, vol. 18, No. 5, May 2017.*

Unsupervised Pixel-Level Domain Adaptation with Generative Adversarial Networks Konstantinos Bousmalis, Nathon Silberman, David Dohan, Dumitru Erhan, Dilip Krishnan arXiv:1612.05424v2[cs.CV] Aug. 23, 2017.*

Yuille et al., "Vision as Bayesian Inference: Analysis by Synthesis?", UCLA Department of Statistics Papers, dated Jan. 1, 2006 (16 pages).

Battaglia et al., "Simulation as an engine of physical scene understanding", Proceedings of the National Academy of Sciences, Nov. 5, 2013, vol. 110, No. 45, pp. 18327-18332 (7 pages).

Miansinghka et al., "Approximate Bayesian Image Interpretation using Generative Probabilistic Graphics Programs", dated Jun. 29, 2013 (10 pages).

Kulkarni et al., "Inverse Graphics with Probabilistic CAD Models", dated Jul. 4, 2014 (10 pages).

Tung et al., "Adversarial Inverse Graphics Networks: Learning 2D-to-3D Lifting and Image-to-Image Translation from Unpaired Supervision", dated Sep. 2, 2017 (14 pages).

Stutz et al., "Learning 3D Shape Completion from Laser Scan Data with Weak Supervision" (10 pages).

Liebelt et al., "Precise Registration of 3D Models To Images by Swarming Particles", Institute of Electrical and Electronics Engineers (IEEE), 2007 (8 pages).

Liebelt et al., "Viewpoint-Independent Object Class Detection using 3D Feature Maps", CVPR 2008—IEEE Conference on Computer Vision & Pattern Recognition, Jun. 2008 (9 pages).

Choy et al., "Enriching Object Detection with 2D-3D Registration and Continuous Viewpoint Estimation", CVPR 2015—IEEE Conference on Computer Vision & Pattern Recognition, 2015, pp. 2512-2520 (9 pages).

Kehl et al., "SSD-6D: Making RGB-Based 3D Detection and 6D Pose Estimation Great Again", dated Nov. 27, 2017 (9 pages).

Engelmann et al., "Joint Object Pose Estimation and Shape Reconstruction in Urban Street Scenes Using 3D Shape Priors", Proc. of German Conf. on Pattern Recognition (GCPR), Hannover, Germany, Sep. 2016 (12 pages).

Engelmann et al., "SAMP: Shape and Motion Priors for 4D Vehicle Reconstruction", IEEE Winter Conference on Applications of Computer Vision (WACV), Santa Rosa, CA, USA, Mar. 2017 (9 pages).

Wu et al., "MarrNet: 3D Shape Reconstruction via 2.5D Sketches", 31st Conference on Neural Information Processing Systems (NIPS 2017), Long Beach, CA, USA, dated Nov. 8, 2017 (11 pages).

Wu et al., "Neural Scene De-rendering", CVPR 2017—IEEE Conference on Computer Vision and Pattern Recognition, 2017, pp. 699-707 (9 pages).

Kulkarni et al., "Deep Convolutional Inverse Graphics Network", dated Jun. 22, 2015 (10 pages).

U.S. Appl. No. 15/893,864, filed Feb. 12, 2018.

* cited by examiner

FIG. 2

Set of real-world frames/tlogs
↓
Analysis-By-Synthesis (SIM)
↓ Set of simulated tlogs
Simulation-To-Real Auto-Labeling
↓
Set of auto-labeled real-world tlogs

Set of real-world frames/tlogs → TLog ETL → (x)
Set of simulated frames/tlogs → TLog ETL → (xs,ys,zs)
zs: Priviledged Info (depth, other GT)
↓
SPIGAN
↓ ML model
ML Inference
↓ (x,y')
Predictive Post-Processing
↓
TLog JOIN
↓
Set of auto-labeled real-world tlogs

154

600

```
Receiving one or more unlabeled real-world driving logs
610
```

```
Automatically labeling the one or more unlabeled real-world driving logs to
generate one or more labeled real-world driving logs, the automatically
labeling including analysis-by-synthesis on the one or more unlabeled real-
world driving logs to generate one or more simulated driving logs and
analysis-by-synthesis on the one or more unlabeled real-world driving logs
to generate one or more simulated driving logs
620
```

```
Storing the one or more labeled real-world driving logs in one or more data
stores of labeled driving logs
630
```

FIG. 6

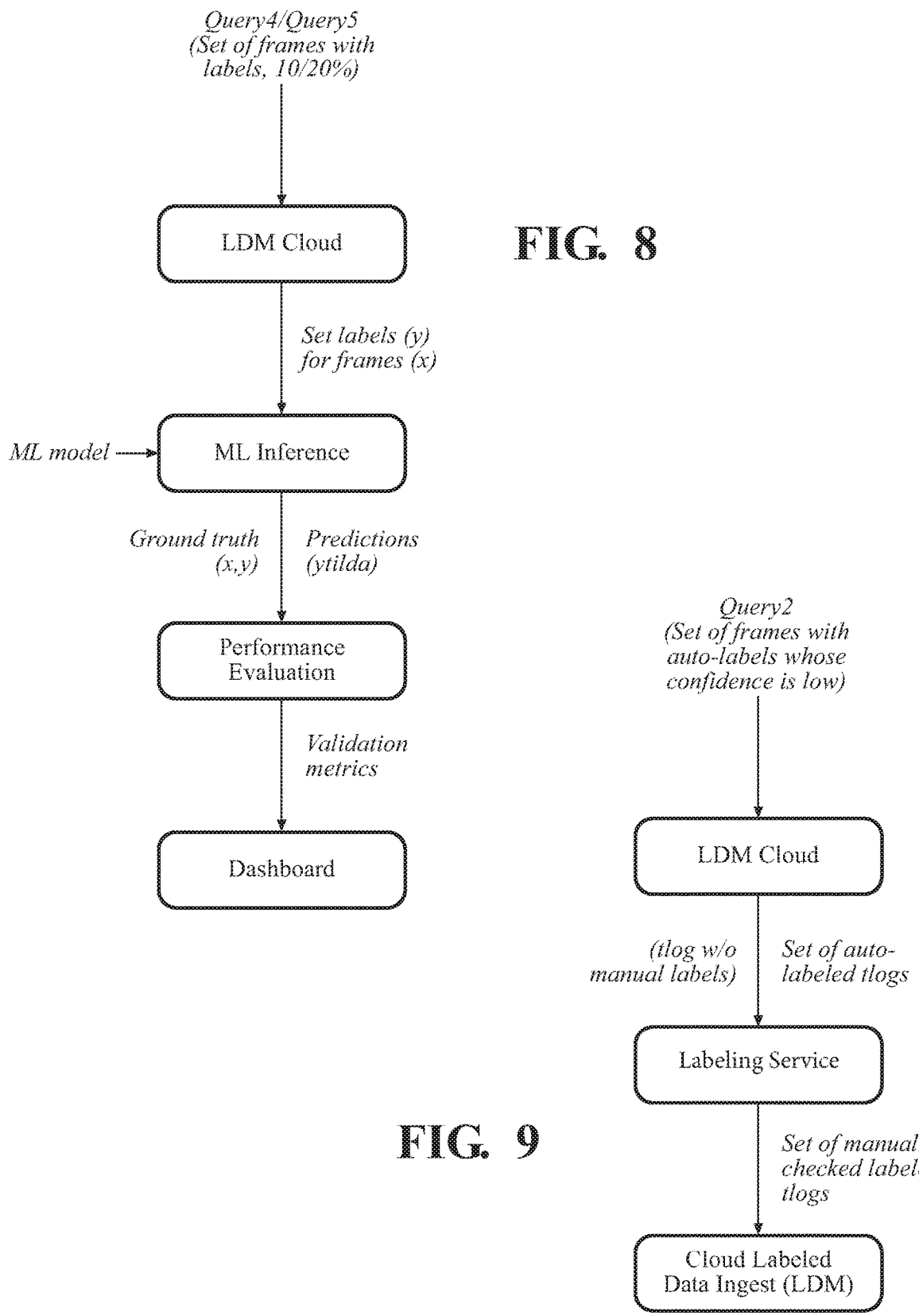

AUTO-LABELING OF DRIVING LOGS USING ANALYSIS-BY-SYNTHESIS AND UNSUPERVISED DOMAIN ADAPTATION

FIELD

The subject matter described herein relates in general to driving logs and, more particularly, to the labeling of driving logs.

BACKGROUND

Labeling a dataset may involve a human manually reviewing an image or video to identify things in the data (e.g., cars, pedestrians, etc.). The identified thing(s) can be labeled by the human reviewer, such as by enclosing them in a virtual bounding box, performing a pixel by pixel identification of the thing(s), and/or by tagging the thing(s). A user interface tool can enable a human reviewer to perform such labeling. The labeled dataset can be useful for training a machine learning algorithm.

SUMMARY

In one respect, the subject matter presented herein relates to a method of automatically labeling driving logs. The method includes receiving one or more unlabeled real-world driving logs. The one or more unlabeled real-world driving logs can include data captured by one or more vehicle sensors. The method can include automatically labeling the one or more unlabeled real-world driving logs to generate one or more labeled real-world driving logs. The automatic labeling can include analysis-by-synthesis on the one or more unlabeled real-world driving logs to generate one or more simulated driving logs. The one or more simulated driving logs include reconstructed driving scenes or portions thereof. The automatic labeling can include simulation-to-real automatic labeling on the one or more simulated driving logs and the one or more unlabeled real-world driving logs to generate one or more labeled real-world driving logs. The method can further include storing the one or more labeled real-world driving logs in one or more data stores.

In another respect, the subject matter presented herein relates to a system for automatically labeling driving logs. The system can include one or more processors. The one or more processors can be programmed to initiate executable operations. The executable operations can include receiving one or more unlabeled real-world driving logs. The one or more unlabeled real-world driving logs can include data captured by one or more vehicle sensors. The executable operations can include automatically labeling the one or more unlabeled real-world driving logs to generate one or more labeled real-world driving logs. The automatic labeling can include analysis-by-synthesis on the one or more unlabeled real-world driving logs to generate one or more simulated driving logs. The one or more simulated driving logs can include reconstructed driving scenes or portions thereof. The automatic labeling can include simulation-to-real automatic labeling on the one or more simulated driving logs and the one or more unlabeled real-world driving logs to generate one or more labeled real-world driving logs. The executable operations can include storing the one or more labeled real-world driving logs in one or more data stores.

BRIEF DESCRIPTION OF THE DRAWINGS

FIG. 2 is an example of an automated labeling module.

FIG. 3 is an example of a simulation-to-real module.

FIG. 6 is an example of a method of automatically labeling driving logs.

FIG. 8 is an example of a validation and/or testing process.

FIG. 9 is an example of a manual quality assurance process.

DETAILED DESCRIPTION

Figure 1:
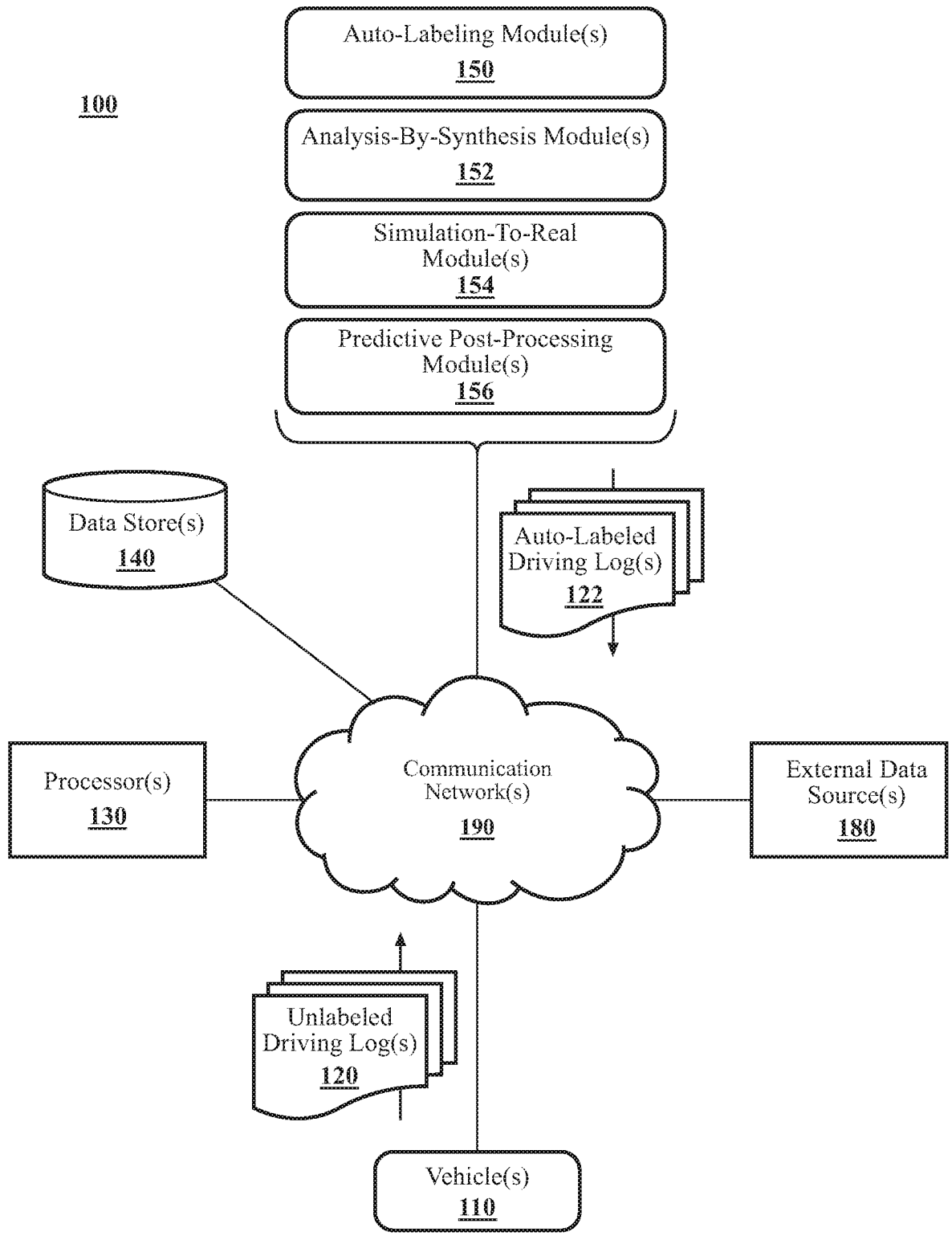
FIG. 1 is an example of a system for auto-labeling of driving logs.
Figure 4:
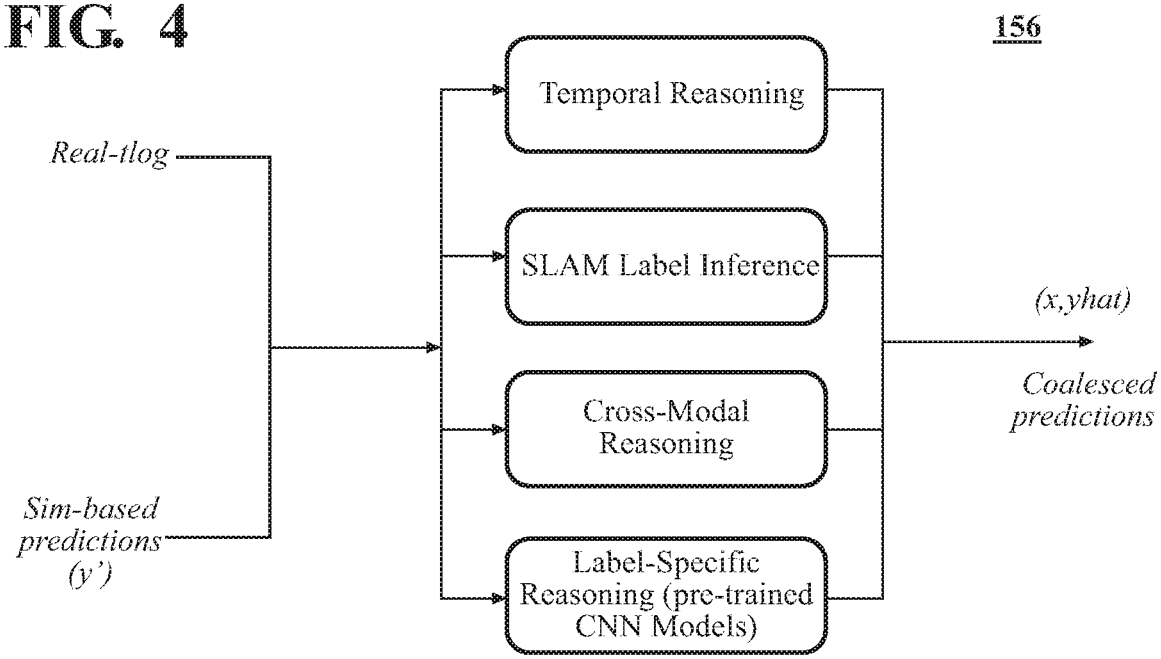
FIG. 4 is an example of a predictive post-processing module.

Manually labeling vehicle data is inefficient and not scalable to large vehicle fleets. Further, acquiring labeled data can be a significant bottleneck in the development of machine learning models that are accurate and efficient enough to enable safety-critical applications, such as automated driving. Accordingly, arrangements described herein are directed automatically labeling vehicle sensor data (e.g., video, images, other sensor data, etc.) recorded during a human or autonomous driving session and stored in driving logs. Arrangements described herein are directed to automatically labeling data captured by vehicle sensors as recorded during a human and/or autonomous driving session and stored in driving logs. "Labels" include supervisory signals required to develop machine learning algorithms. Such machine learning algorithms can be for various driving systems, including, for example, Automated Driver Assistance and Autonomous Driving Systems. Labels can include, but are not limited to, localized semantic information such as bounding boxes or segmentation masks around vehicles, pedestrians, and/or other objects perceived by vehicle sensors.

Arrangements described herein can automate the labeling process using simulation tools that use systems and techniques based on analysis-by-synthesis and/or unsupervised domain adaptation. Arrangements described herein can automatically generate labels for real-world driving logs by simulating real-world driving logs or portions thereof using analysis-by-synthesis techniques. Arrangements described herein can use one or more simulators to automatically generate labels for the simulated driving logs. Arrangements described herein can train a machine learning model, including, for example, deep neural networks, using the simulated driving logs and labels. Arrangements described herein can use the trained machine learning model to predict labels for the real-world driving logs.

Detailed embodiments are disclosed herein; however, it is to be understood that the disclosed embodiments are intended only as examples. Therefore, specific structural and functional details disclosed herein are not to be interpreted as limiting, but merely as a basis for the claims and as a representative basis for teaching one skilled in the art to variously employ the aspects herein in virtually any appropriately detailed structure. Further, the terms and phrases used herein are not intended to be limiting but rather to provide an understandable description of possible implementations. Various embodiments are shown in FIGS. 1-9, but the embodiments are not limited to the illustrated structure or application.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details.

Referring to FIG. 1, an example of a system 100 for automated labeling of driving logs is shown. "Driving log" includes any data or information captured by one or more vehicle sensors about the external environment of the vehicle. A driving log can also include information about the vehicle itself. In some instances, the driving log can include external meta-data about the driving scene (e.g., maps, weather reports, user-provided meta-data, etc.).

Some of the possible elements of the system 100 are shown in FIG. 1 and will now be described. It will be understood that it is not necessary for the system 100 to have all of the elements shown in FIG. 1 or described herein. The system 100 can include one or more vehicles 110, one or more processors 130, one or more data stores 140, one or more modules (e.g., auto-labeling module(s) 150, analysis-by-synthesis module(s) 152, simulation-to-real module(s) 154, predictive post-processing module(s) 156), and/or one or more external data sources 180.

The various elements of the system 100 can be communicatively linked to each other (or any combination thereof) through one or more communication networks 190. As used herein, the term "communicatively linked" can include direct or indirect connections through a communication channel or pathway or another component or system. A "communication network" means one or more components designed to transmit and/or receive information from one source to another. The data store(s) 140 and/or one or more of the elements of the system 100 can include and/or execute suitable communication software, which enables the various elements to communicate with each other through the communication network and perform the functions disclosed herein.

The one or more communication networks 190 can be implemented as, or include, without limitation, a wide area network (WAN), a local area network (LAN), the Public Switched Telephone Network (PSTN), a wireless network, a mobile network, a Virtual Private Network (VPN), the Internet, and/or one or more intranets. The one or more communication networks 190 further can be implemented as or include one or more wireless networks, whether short range (e.g., a local wireless network built using a Bluetooth or one of the IEEE 802 wireless communication protocols, e.g., 802.11a/b/g/i, 802.15, 802.16, 802.20, Wi-Fi Protected Access (WPA), or WPA2) or long range (e.g., a mobile, cellular, and/or satellite-based wireless network; GSM, TDMA, CDMA, WCDMA networks or the like). The communication network(s) 190 can include wired communication links and/or wireless communication links. The communication network(s) 190 can include any combination of the above networks and/or other types of networks.

Each of the above noted elements of the system 100 will be described in turn below. The system 100 can include one or more vehicles 110. "Vehicle" means any form of motorized transport, now known or later developed. Non-limiting examples of the vehicle(s) 110 include automobiles, watercraft, aircraft, spacecraft, or any other form of motorized transport. The vehicle(s) 110 may be operated manually by a human driver, semi-autonomously by a mix of manual inputs from a human driver and autonomous inputs by one or more vehicle computers, or fully autonomously by one or more vehicle computers. In at least some instances, the vehicle(s) 110 can be configured to switch between two or more of these operational modes.

The vehicle(s) 110 can include one or more processors, one or more data stores, and one or more sensors. "Sensor" means any device, component and/or system that can detect, determine, assess, monitor, measure, quantify and/or sense something. The one or more sensors can detect, determine, assess, monitor, measure, quantify and/or sense in real-time. As used herein, the term "real-time" means a level of processing responsiveness that a user or system senses as sufficiently immediate for a particular process or determination to be made, or that enables the processor to keep up with some external process.

In arrangements in which the vehicle(s) 110 includes a plurality of sensors, the sensors can work independently from each other. Alternatively, two or more of the sensors can work in combination with each other. In such case, the two or more sensors can form a sensor network.

The vehicle(s) 110 can include any suitable type of sensor. Various examples of different types of sensors will be described herein. However, it will be understood that the embodiments are not limited to the particular sensors described.

The vehicle(s) 110 can include one or more vehicle sensors. The vehicle sensor(s) can detect, determine, assess, monitor, measure, quantify and/or sense information about the vehicle(s) 110 (e.g., position, orientation, speed, driver/computer inputs, settings, etc.). For example, in one or more arrangements, the vehicle sensor(s) can include accelerometers, gyroscopes, inertial measurement unit (IMU) sensors, speedometers, yaw rate sensors, pedal position/pressure sensors, steering wheel position sensors, engine sensors, and/or other suitable sensors. In one or more arrangements, the vehicle sensor(s) can include a global navigation satellite system (GNSS), a global positioning system (GPS), a navigation system (which can be the navigation system, and/or other suitable sensors.

The vehicle(s) 110 can include one or more environment sensors configured to acquire, detect, determine, assess, monitor, measure, quantify and/or sense driving environment data. "Driving environment data" includes and data or information about the external environment in which a vehicle is located or one or more portions thereof. As an example, in one or more arrangements, the environment sensors can include one or more cameras, one or more radar sensors, one or more LIDAR sensors, one or more sonar sensors, and/or one or more ranging sensors. The environment sensors can detect, determine, assess, monitor, measure, quantify and/or sense, directly or indirectly, the presence of one or more obstacles in the external environment of the vehicle(s) 110 and information about such obstacles (e.g., position, distance, speed, etc.).

Driving environment data acquired by one or more sensors of the vehicle 110 can be stored as a driving log 120. Such a driving log may be referred to herein as a real-world driving log, indicating that the driving log includes data acquired in the real world (as opposed to simulation data). The driving logs 120 can include raw sensor data without any associated labels. The driving logs 120 can be sent to one or more other elements of the system 100.

The system 100 can include one or more processors 130. "Processor" means any component or group of components that are configured to execute any of the processes described herein or any form of instructions to carry out such processes or cause such processes to be performed. The processor(s) 130 may be implemented with one or more general-purpose and/or one or more special-purpose processors. Examples of suitable processors include microprocessors, microcontrollers, DSP processors, and other circuitry that can execute software. Further examples of suitable processors include, but are not limited to, a central processing unit (CPU), an array processor, a vector processor, a digital signal processor (DSP), a field-programmable gate array (FPGA), a programmable logic array (PLA), an application specific integrated circuit (ASIC), programmable logic circuitry, and a controller. The processor(s) 130 can include at least one hardware circuit (e.g., an integrated circuit) configured to carry out instructions contained in program code. In arrangements in which there is a plurality of processors 130, such processors can work independently from each other, or one or more processors can work in combination with each other.

The system 100 can include one or more data stores 140 for storing one or more types of data. The data store 140 can include volatile and/or non-volatile memory. Examples of suitable data stores 140 include RAM (Random Access Memory), flash memory, ROM (Read Only Memory), PROM (Programmable Read-Only Memory), EPROM (Erasable Programmable Read-Only Memory), EEPROM (Electrically Erasable Programmable Read-Only Memory), registers, magnetic disks, optical disks, hard drives, or any other suitable storage medium, or any combination thereof. The data store 140 can be a component of the processor(s) 130, or the data store 140 can be operatively connected to the processor(s) 130 for use thereby. The term "operatively connected," as used throughout this description, can include direct or indirect connections, including connections without direct physical contact.

In one or more arrangements, the system 100 can include map data. The map data can be stored in one or more of the data stores 140. The map data can include maps of one or more geographic areas. In some instances, the map data can include information or data on roads, traffic control devices, road markings, structures, features, and/or landmarks in the one or more geographic areas. The map data can be in any suitable form. In some instances, the map data can include aerial views of an area. In some instances, the map data can include ground views of an area, including 360 degree ground views. The map data can include measurements, dimensions, distances, and/or information for one or more items included in the map data and/or relative to other items included in the map data. The map data can include a digital map with information about road geometry. In one or more arrangement, the map data can information about the ground, terrain, roads, surfaces, and/or other features of one or more geographic areas. The map data can include elevation data in the one or more geographic areas. The map data can define one or more ground surfaces, which can include paved roads, unpaved roads, land, and other things that define a ground surface. The map data can be high quality and/or highly detailed. In one or more arrangements, the map data can be included in one or more of the data stores 140.

The system 100 can include one or more modules, at least some of which will be described herein. The modules can be implemented as computer readable program code that, when executed by a processor, implement one or more of the various processes described herein. One or more of the modules can be a component of the processor(s) 130, or one or more of the modules can be executed on and/or distributed among other processing systems to which the processor(s) 130 is operatively connected. One or more of the modules can be stored on one or more data stores 140. The modules can include instructions (e.g., program logic) executable by one or more processor(s) 130. Alternatively or in addition, one or more data stores 140 may contain such instructions.

In one or more arrangements, one or more of the modules described herein can include artificial or computational intelligence elements, e.g., neural network, fuzzy logic or other machine learning algorithms. Further, in one or more arrangements, one or more of the modules can be distributed among a plurality of the modules described herein. In one or more arrangements, two or more of the modules described herein or portions thereof can be combined into a single module.

The system 100 can include one or more auto-labeling modules 150. FIG. 2 shows one example of the operation of the auto-labeling module(s) 150. The auto-labeling module(s) 150 can be configured to query a source of unlabeled driving logs (e.g., a data store, a vehicle 110, etc.) for unlabeled driving logs 120 and/or can other be configured to receive unlabeled driving logs 120 from such sources. For instance, the unlabeled driving logs 120 can be received directly from one or more vehicles 110. Alternatively or in addition, the unlabeled driving logs 120 can be acquired or accessed from one or more data stores 140, which can be, for example, a cloud-based data store or a large scale data storage medium. In one or more arrangements, the auto-labeling module(s) 150 can query the source of unlabeled driving logs for unlabeled driving logs 120 that satisfy one or more desired conditions or parameters, such as a specific file format. The auto-labeling module(s) 150 can be configured to initiate the query automatically and/or responsive to receiving an input from a user (e.g., a person). Labels for the unlabeled driving logs can be programmatically estimated by the auto-labeling module(s) 150. The output of the auto-labeling module(s) 150 can be labeled real-world logs 122 (see also "Set of auto-labeled real-world tlogs" in FIG. 5), which can include the raw log measurements captured from the vehicle along with ground truth labels that have been automatically labeled by one or more simulation-to-real modules 154. The driving logs and their automatically generated labels can be stored and indexed using standard database techniques in one or data stores for future retrieval and training purposes as described herein.

The auto-labeling module(s) 150 can generate labels for the unlabeled driving logs using, at least in part, analysis-by-synthesis. Thus, the system 100 can include one or more analysis-by-synthesis modules 152. The analysis-by-synthesis module(s) 152 can include an analysis-by-synthesis engine coupled with a transfer mechanism. The analysis-by-synthesis module(s) 152 can be configured to perform any analysis-by-synthesis technique, now known or later developed. Generally, analysis-by-synthesis refers to a recognition process in which hypotheses are formulated and compared with input data until one of the hypotheses produces a match. The analysis-by-synthesis module(s) 152 can use a simulator (e.g., Unreal Engine available from Epic Games, Inc., Cary, N.C.). The simulator can be a combination of software and hardware configured to create a synthetic or simulated driving log of the external environment of the vehicle. The simulator can create, for example, a simulated image of a cityscape with objects therein (e.g., buildings, roads, people, vehicles, green spaces, etc.). The simulator can also create a set of labels (e.g., semantic segmentation labels) and/or privileged information (e.g., depth information, instance segmentation information, object detection information, optical flow information, etc.) that correspond to the simulated image or data. The simulator may internally compute the relationships between simulated objects depicted within the simulated image. The simulator may use real-world data acquired by one or more vehicle sensors.

The analysis-by-synthesis module(s) 152 can also use any suitable computer vision and computer graphics techniques, now known or later developed. Non-limiting examples of computer vision and computer graphics techniques include structure-from-motion algorithms, CAD model to 2D image fitting, de-rendering, and other techniques described such as those described in U.S. Pat. Nos. 10,019,652 and 10,643,320, which are incorporated herein by reference.

Using real-world unlabeled driving logs, the analysis-by-synthesis module(s) 152 can generate a set of diverse simulated logs. The simulated driving logs can contain photo-realistic renderings of the observed real-world scenario along with ground truth labels computed programmatically. The analysis-by-synthesis module(s) 152 can use the simulator and computer vision and computer graphics techniques together to reconstruct the recorded driving scenes, or relevant parts thereof. The ground truth labels computed by the simulator (e.g., using its rendering and physics engine) can include semantic segmentation, depth, 2D and 3D object detection bounding boxes, object class labels, and other metadata that is directly accessible within the simulation engine. The resulting set of simulated logs along with their ground truth labels ("set of simulated tlogs" in FIG. 5) and the original set of real-world logs can be used as inputs to the simulation-to-real module(s) 154, which can automatically compute labels for the real-world unlabeled driving logs, as will be described below The auto-labeling module(s) 150 can generate labels for the unlabeled driving logs using, at least in part, simulation-to-real techniques. Thus, the system 100 can include one or more simulation-to-real modules 154. The simulation-to-real module(s) 154 can use any suitable technique for simulation-to-real transfer, now known or later developed. Referring to FIG. 3, using the simulation-to-real module(s) 154, ground truth labels of real-world driving logs can be automatically procured by leveraging their associated simulated driving logs. For instance, an unsupervised domain adaptation algorithm can be used to learn a model specifically for generating labels for the desired tasks (e.g., traffic light detection). One example of an unsupervised domain adaptation algorithm is SPIGAN, which is described in U.S. patent application Ser. No. 15/893,864, which is incorporated by reference herein in its entirety. The unsupervised domain adaptation algorithm can use the simulated labeled data ("(xs, ys, zs)" extracted by a "TLog ETL" program that can Extract, Transform, and Load this information from the simulated logs) and unlabeled data from the real-world logs ("(x)"). The resulting learned machine learning model ("ML model") can then be applied directly ("ML inference") on the input real-world logs to compute task-specific labels ("y"), thereby obtaining an "automatically labeled" dataset for subsequent model development.

As with any unsupervised procedure, a high quality in the output labels should be ensured and the introduction of noisy labels along the process should be avoided. To remedy this potential side-effect, a predictive post-processing step can be incorporated to enhance the overall label quality of the automatically labeled logs inferred from the learned machine learning model output. Accordingly, referring to FIG. 4, the system 100 can include one or more predictive post-processing modules 156. The predictive post-processing module(s) 156 be configured to use any suitable predictive post-processing techniques, now known or later developed. The predictive post-processing module(s) 156 can incorporate various constraints. For example, the predictive post-processing module(s) 156 can include spatio-temporal consistencies, which can check to ensure that object labels for static scenes are spatially consistent between subsequent observations. The predictive post-processing module(s) 156 can include geometric consistencies, which can check for semantic label consistency of the environment using an existing labeled map and camera localization (e.g., obtained using simultaneous localization and mapping (SLAM) techniques). The predictive post-processing module(s) 156 can include cross-modal consistencies, which include labels extracted from various modalities (including LIDARs, cameras, radars, and/or sonars) that can be fused to improve label quality. The predictive post-processing module(s) 156 can include label-specific reasoning using prior knowledge (like traffic light state cycles or pre-trained label-specific convolutional neural networks (CNN) models). All of these constraints can reduce or correct the potentially noisy labels introduced in the simulation-to-real auto-labeling stage. The resulting labels from each of the aforementioned techniques can be fused and subsequently used for training.

In some instances, the system 100 can include one or more external data sources 180. In one or more arrangements, the one or more external data sources 180 can include information about the external environment of the vehicle(s) 110. Examples of such other information include the time of day, weather conditions, road conditions, road construction, maps, etc. Information from the one or more external data sources 180, such as a remote server or data store, can be accessed by one or more elements of the system 100. Such information can be useful is various situations.

Now that the various potential systems, devices, elements and/or components of the system 100 for labeling visual data have been described, various methods will now be described. Various possible steps of such methods will now be described. The methods described may be applicable to the arrangements described above, but it is understood that the methods can be carried out with other suitable systems and arrangements. Moreover, the methods may include other steps that are not shown here, and in fact, the methods are not limited to including every step shown. The blocks that are illustrated here as part of the methods are not limited to the particular chronological order. Indeed, some of the blocks may be performed in a different order than what is shown and/or at least some of the blocks shown can occur simultaneously.

Figure 5:
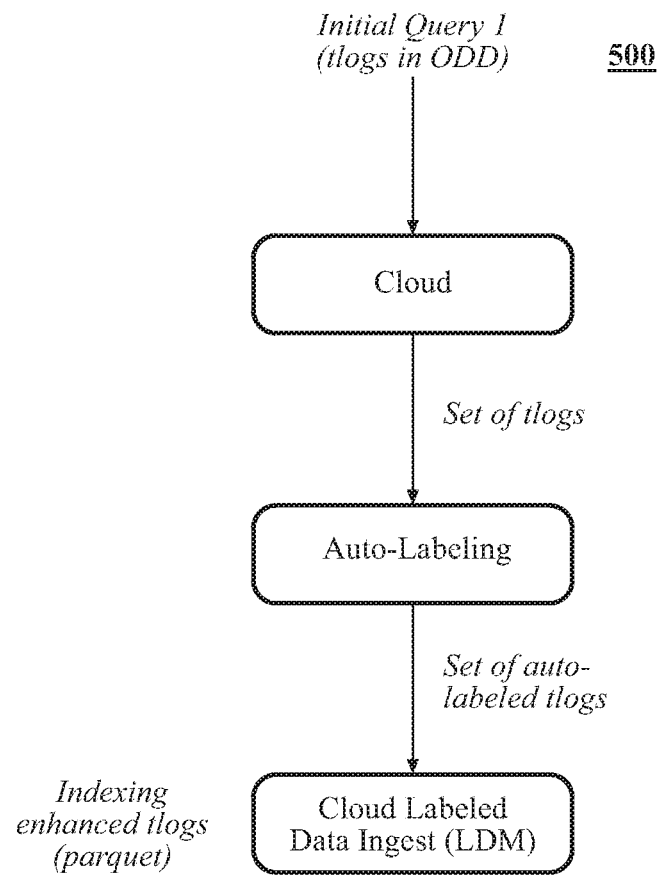
FIG. 5 is an example of an automated labeling process.

Referring to FIG. 5, an example of a process 500 for automatically labeling of unlabeled data collected from vehicles is shown. A query ("Initial query1") can be made to one or more data stores 510 to trigger the automatic labeling of a set of unlabeled driving logs ("set of tlogs"). It should be noted that the data store 510 can be one of the data stores 140 in FIG. 1. The inquiry can include one or more qualifiers of the type of unlabeled driving logs desired. For instance, the inquiry can specify a set of unlabeled driving logs satisfying some desired conditions (e.g., "tlogs in ODD"— tlog being an example of a specific file format, and ODD referring to an Operational Design Domain). The inquiry can be initiated by a user and/or the auto-labeling module(s) 150 or other module.

Labels for these driving logs can be programmatically estimated by the auto-labeling module(s) 150. The driving logs and their automatically generated labels ("set of auto-labeled tlogs") can be stored and indexed using standard database techniques in a data store, such as a cloud-based data store (e.g., Labeled Data Mart (LDM) 520), for future retrieval and training purposes as described herein. In one or more arrangements, the LDM 520 can be configured to manage all the labels available for any particular driving log (simulated and real-world logs).

Referring now to FIG. 6, an example of a method 600 of automatically labeling driving logs is shown. At block 610, one or more unlabeled real-world driving logs can be received. The unlabeled real-world driving log(s) can include data captured by one or more vehicle sensors. The unlabeled real-world driving log(s) can be received from any suitable source (e.g., vehicle(s) 110, data store(s) 140, etc.). The unlabeled real-world driving log(s) can be received responsive to a query by one or more components of the automated labeling system 100 (e.g. the auto-labeling module(s) 150) or responsive to a user command or an event, just to name a few possibilities. The method 600 can continue to block 620.

At block 620, the unlabeled real-world driving log(s) can be automatically labeled to generate one or more labeled real-world driving logs. The automatic labeling can include analysis-by-synthesis on the one or more unlabeled real-world driving logs to generate one or more simulated driving logs. The automatic labeling can further include simulation-to-real automatic labeling on the one or more simulated driving logs and the one or more unlabeled real-world driving logs to generate one or more labeled real-world driving logs. The labeling can be performed by, for example, the auto-labeling modules 150, the analysis-by-synthesis module(s) 152, the simulation-to-real module(s) 154, and/or the processor(s) 130. The method 600 can continue to block 630.

At block 630, the one or more labeled real-world driving logs can be stored in one or more data stores of labeled driving logs. The method 600 can end. Alternatively, the method 600 can return to block 610 or to some other block. The method 600 can be repeated at any suitable point, such as at a suitable time or upon the occurrence of any suitable event or condition.

Figure 7:
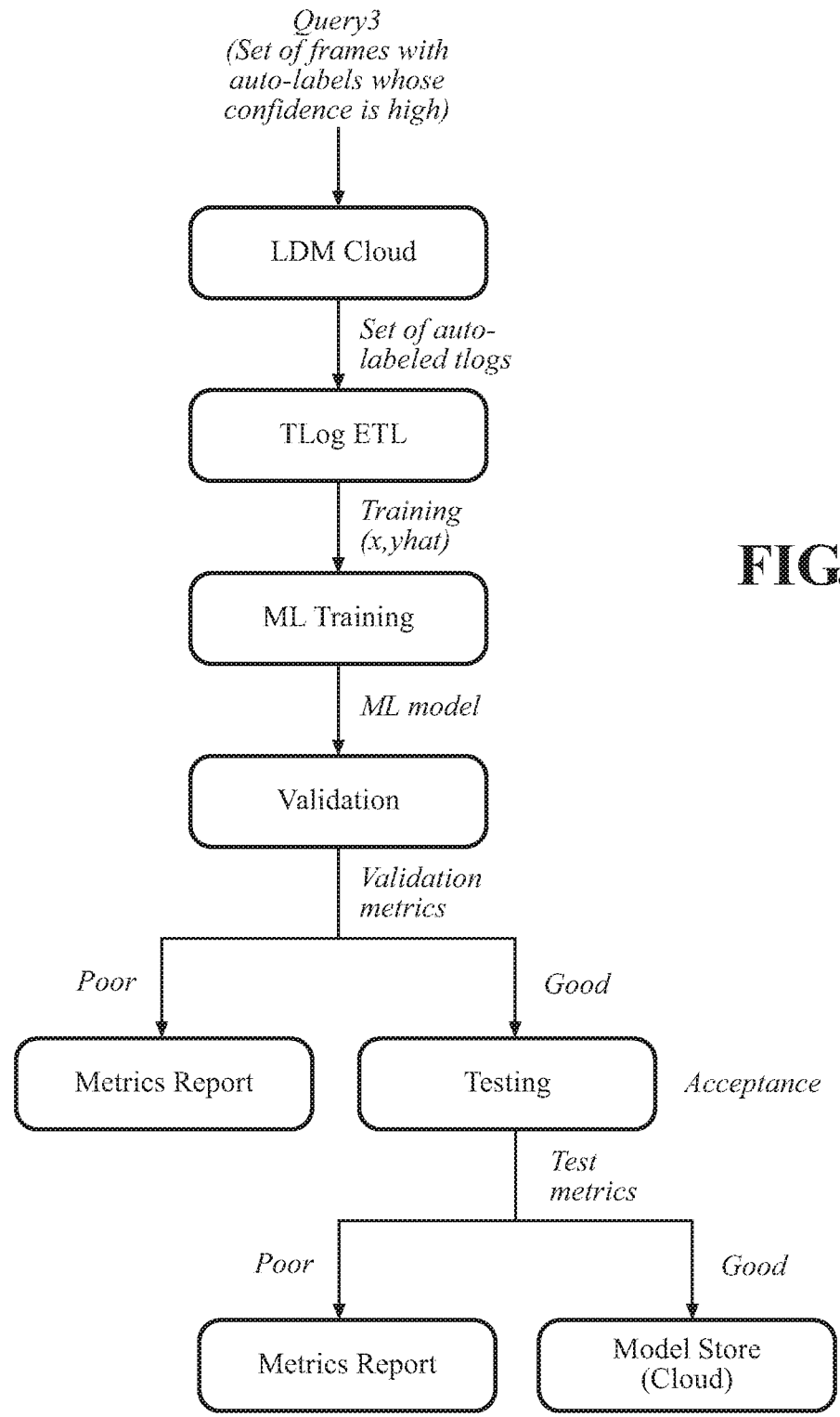
FIG. 7 is an example of a training/validation/evaluation/model management process.

It should be noted that the labeled real-world driving logs can be used for various purposes. For instance, the labeled real-world driving logs can be used in connection with machine learning for training, validation, evaluation, and/or model management purposes. Referring to FIG. 7, an example of the training, validation, evaluation, and model management of a machine learning training pipeline is shown. In some arrangements, a full end-to-end software stack can support the training from auto-labeled data for the desired tasks (obtained by "Query3"), validation, testing, evaluation, and management of machine learning models. The validation and testing can use held out human-labeled real-world data with corresponding performance metrics.

Referring to FIG. 8, details of the validation and/or testing blocks of FIG. 7 are shown. In the validation and testing stages, the trained machine learning model can be evaluated against gold-standard labels. The gold-standard labels can be procured, for example, through human-crowdsourcing. The performance metrics of the trained machine learning model can be further reported to a dashboard for monitoring purposes.

In some arrangements, a portion of the real-world driving logs can be held out for validating and testing the performance of the unsupervised trained machine learning model. One example of a manual quality assurance process is shown in FIG. 9. The labels for these validation and test sets can be acquired in any suitable manner. For instance, they can be acquired from human annotators, such as by crowd-sourcing. The human annotators can manually provide reference ground truth, which can be considered as the gold-standard for testing and validating the performance of the trained machine learning model. All of the labels accumulated through both manual and automatic labeling can be stored together in the same labeled data set (e.g., the same labeled data mart) for future uses.

It will be appreciated that arrangements described herein can provide numerous benefits, including one or more of the benefits mentioned herein. For example, arrangements described herein can create a more streamlined and/or automated approach to labeling of driving logs. Arrangements described herein can enable the development of high performance algorithms by training supervised machine learning models on very large amounts of automatically labeled data. Arrangements described herein can reduce the need for human labeling of the driving logs. Arrangements described herein can continue to scale the various labeling procedures more efficiently to build a pipeline of labeled images to be processed more quickly and categorically. Arrangements described herein enables a scalable procedure to learn machine learning models using large volumes of unlabeled data collected by a fleet of vehicles, with little to no added cost of acquiring ground truth labels. Arrangements described here can result in a high quality data set that can be used for various purposes, such as testing vehicle driving software.

The flowcharts and block diagrams in the figures illustrate the architecture, functionality, and operation of possible implementations of systems, methods and computer program products according to various embodiments. In this regard, each block in the flowcharts or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved.

The systems, components and/or processes described above can be realized in hardware or a combination of hardware and software and can be realized in a centralized fashion in one processing system or in a distributed fashion where different elements are spread across several interconnected processing systems. Any kind of processing system or other apparatus adapted for carrying out the methods described herein is suited. A typical combination of hardware and software can be a processing system with computer-usable program code that, when being loaded and executed, controls the processing system such that it carries out the methods described herein. The systems, components and/or processes also can be embedded in a computer-readable storage, such as a computer program product or other data programs storage device, readable by a machine, tangibly embodying a program of instructions executable by the machine to perform methods and processes described herein. These elements also can be embedded in an application product which comprises all the features enabling the implementation of the methods described herein and, which when loaded in a processing system, is able to carry out these methods.

Furthermore, arrangements described herein may take the form of a computer program product embodied in one or more computer-readable media having computer-readable program code embodied or embedded, e.g., stored, thereon. Any combination of one or more computer-readable media may be utilized. The computer-readable medium may be a computer-readable signal medium or a computer-readable storage medium. The phrase "computer-readable storage medium" means a non-transitory storage medium. A computer-readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer-readable storage medium would include the following: an electrical connection having one or more wires, a portable computer diskette, a hard disk drive (HDD), a solid state drive (SSD), a random access memory (RAM), a read-only memory (ROM), an erasable programmable read-only memory (EPROM or Flash memory), an optical fiber, a portable compact disc read-only memory (CD-ROM), a digital versatile disc (DVD), an optical storage device, a magnetic storage device, or any suitable combination of the foregoing. In the context of this document, a computer-readable storage medium may be any tangible medium that can contain, or store a program for use by or in connection with an instruction execution system, apparatus, or device.

Program code embodied on a computer-readable medium may be transmitted using any appropriate medium, including but not limited to wireless, wireline, optical fiber, cable, RF, etc., or any suitable combination of the foregoing. Computer program code for carrying out operations for aspects of the present arrangements may be written in any combination of one or more programming languages, including an object oriented programming language such as Java™, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising (i.e. open language). The phrase "at least one of . . . and . . . " as used herein refers to and encompasses any and all possible combinations of one or more of the associated listed items. As an example, the phrase "at least one of A, B and C" includes A only, B only, C only, or any combination thereof (e.g., AB, AC, BC or ABC).

Aspects herein can be embodied in other forms without departing from the spirit or essential attributes thereof. Accordingly, reference should be made to the following claims, rather than to the foregoing specification, as indicating the scope of the invention.

What is claimed is:

1. A method of automatically labeling driving logs, the method comprising:
   receiving one or more unlabeled real-world driving logs, the one or more unlabeled real-world driving logs including data captured by one or more vehicle sensors;
   automatically labeling the one or more unlabeled real-world driving logs to generate one or more labeled real-world driving logs, the automatically labeling including:
      analysis-by-synthesis on the one or more unlabeled real-world driving logs to generate one or more simulated driving logs, whereby the one or more simulated driving logs include reconstructed driving scenes or portions thereof; and
      simulation-to-real automatic labeling on the one or more simulated driving logs and the one or more unlabeled real-world driving logs to generate one or more labeled real-world driving logs; and
   storing the one or more labeled real-world driving logs in one or more data stores of labeled driving logs.

2. The method of claim 1, wherein the one or more simulated driving logs include photo-realistic renderings of an observed real-world scenario with one or more ground truth labels.

3. The method of claim 2, wherein the one or more ground truth labels include semantic segmentation, depth, two-dimensional object detection bounding boxes, three-dimensional object detection bounding boxes, or object class labels.

4. The method of claim 1, wherein analysis-by-synthesis includes using a simulator together with computer vision techniques or computer graphing techniques.

5. The method of claim 1, wherein the one or more unlabeled real-world driving logs include camera data, radar data, LIDAR data, or sonar data.

6. The method of claim 1, wherein the simulation-to-real automatic labeling on the one or more simulated driving logs and the one or more unlabeled real-world driving logs to generate one or more labeled real-world driving logs includes:
   using an unsupervised domain adaptation algorithm on the one or more simulated driving logs and the one or more unlabeled real-world driving logs to learn a model specifically for generating labels for one or more desired tasks;
   applying the model to the one or more unlabeled real-world driving logs to determine task-specific labels; and
   applying the task-specific labels to the one or more unlabeled real-world driving logs to generate the one or more labeled real-world driving logs.

7. The method of claim 6, wherein the simulation-to-real automatic labeling on the one or more simulated driving logs and the one or more unlabeled real-world driving logs to generate one or more labeled real-world driving logs includes:
   performing predictive post-processing on the generated one or more labeled real-world driving logs, whereby potentially noisy labels introduced in the simulation-to-real automatic labeling are reduced or corrected.

8. The method of claim 7, wherein the predictive post-processing includes spatio-temporal consistencies, geometric consistencies, cross-modal consistencies, and label-specific reasoning.

9. The method of claim 7, wherein the predictive post-processing includes temporal reasoning, SLAM label inference, cross-model reasoning, or label-specific reasoning using pre-trained convolutional neural network models.

10. The method of claim 1, wherein the one or more labeled real-world driving logs include raw measurements captured by the one or more vehicle sensors and from ground truth labels that have been automatically labeled by the simulation-to-real automatic labeling.

11. The method of claim 1, further including indexing the one or more labeled real-world driving logs.

12. A system for automatically labeling driving logs, the system comprising:
one or more processors, the one or more processors being programmed to initiate executable operations comprising:
receiving one or more unlabeled real-world driving logs, the one or more unlabeled real-world driving logs including data captured by one or more vehicle sensors;
automatically labeling the one or more unlabeled real-world driving logs to generate one or more labeled real-world driving logs, the automatically labeling including:
analysis-by-synthesis on the one or more unlabeled real-world driving logs to generate one or more simulated driving logs, whereby the one or more simulated driving logs include reconstructed driving scenes or portions thereof; and
simulation-to-real automatic labeling on the one or more simulated driving logs and the one or more unlabeled real-world driving logs to generate one or more labeled real-world driving logs; and
storing the one or more labeled real-world driving logs in one or more data stores of labeled driving logs.

13. The system of claim 12, wherein the one or more simulated driving logs include photo-realistic renderings of an observed real-world scenario along with one or more ground truth labels, and wherein the ground truth labels include semantic segmentation, depth, two-dimensional object detection bounding boxes, three-dimensional object detection bounding boxes, or object class labels.

14. The system of claim 12, wherein analysis-by-synthesis includes using a simulator together with computer vision techniques or computer graphing techniques.

15. The system of claim 12, wherein the unlabeled real-world driving logs include camera data, radar data, LIDAR data, or sonar data.

16. The system of claim 12, wherein the simulation-to-real automatic labeling on the one or more simulated driving logs and the one or more unlabeled real-world driving logs to generate one or more labeled real-world driving logs includes:
using an unsupervised domain adaptation algorithm on the one or more simulated driving logs and the one or more unlabeled real-world driving logs to learn a model specifically for generating labels for one or more desired tasks;
applying the model to the one or more unlabeled real-world driving logs to determine task-specific labels; and
applying the task-specific labels to the one or more unlabeled real-world driving logs to generate the one or more labeled real-world driving logs.

17. The system of claim 16, wherein the simulation-to-real automatic labeling on the one or more simulated driving logs and the one or more unlabeled real-world driving logs to generate one or more labeled real-world driving logs includes:
performing predictive post-processing on the generated one or more labeled real-world driving logs, whereby potentially noisy labels introduced in the simulation-to-real automatic labeling are reduced or corrected.

18. The system of claim 17, wherein the predictive post-processing includes spatio-temporal consistencies, geometric consistencies, cross-modal consistencies, and label-specific reasoning.

19. The system of claim 17, wherein the predictive post-processing includes temporal reasoning, SLAM label inference, cross-model reasoning, or label-specific reasoning using pre-trained convolutional neural network models.

20. The system of claim 12, wherein the one or more labeled real-world driving logs include raw measurements captured by the one or more vehicle sensors and from ground truth labels that have been automatically labeled by the simulation-to-real automatic labeling.

* * * * *